United States Patent [19]
Akiha et al.

[11] Patent Number: 6,054,175
[45] Date of Patent: Apr. 25, 2000

[54] CONDUCTIVE FILLER, CONDUCTIVE PASTE AND METHOD OF FABRICATING CIRCUIT BODY USING THE CONDUCTIVE PASTE

[75] Inventors: Yoshinobu Akiha; Tatsuya Kato; Hitoshi Ushijima, all of Shizuoka, Japan

[73] Assignee: Yazaki Corporation, Tokyo, Japan

[21] Appl. No.: 09/084,785

[22] Filed: May 27, 1998

[30] Foreign Application Priority Data

May 28, 1997 [JP] Japan .................................. 9-138801
Dec. 9, 1997 [JP] Japan .................................. 9-338693

[51] Int. Cl.[7] .............................. H01B 1/22; B05D 5/12
[52] U.S. Cl. ...................... 427/123; 427/191; 427/201; 427/384; 252/512; 204/192.15
[58] Field of Search .................... 252/512, 513, 252/514; 156/47; 174/257; 427/96, 123, 125, 384, 190, 191, 201, 216, 217; 204/192.15

[56] References Cited

U.S. PATENT DOCUMENTS

| | | | |
|---|---|---|---|
| 4,102,722 | 7/1978 | Shoop | 156/99 |
| 4,711,814 | 12/1987 | Teichmann | 428/403 |
| 4,882,227 | 11/1989 | Iwase et al. | 428/407 |
| 5,091,114 | 2/1992 | Nakajima et al. | 252/514 |
| 5,453,293 | 9/1995 | Beane et al. | 427/96 |
| 5,540,379 | 7/1996 | Kazem-Goudarzi et al | 228/248.5 |

FOREIGN PATENT DOCUMENTS

| | | |
|---|---|---|
| 0 708 582 | 4/1996 | European Pat. Off. . |
| 52-003194 | 1/1977 | Japan . |
| 53-133799 | 11/1978 | Japan . |
| 55-160072 | 12/1980 | Japan . |
| 57-113505 | 7/1982 | Japan . |
| 61-957662 | 3/1986 | Japan . |
| 63-18691 | 1/1988 | Japan . |
| 3-48485 | 3/1991 | Japan . |
| 5-028829 | 2/1993 | Japan . |
| 8-315637 | 11/1996 | Japan . |
| WO 93 06943 | 4/1993 | WIPO . |
| WO 96 13041 | 4/1996 | WIPO . |
| WO 96 30966 | 10/1996 | WIPO . |

OTHER PUBLICATIONS

Murthy "Permanent EMI Shieldig of Plastic. . . " *Ann. Tech. Conf —Soc. Plest. Eng* 1994 (2) Abstract Only, 1994.

*Primary Examiner*—Mark Kopec
*Attorney, Agent, or Firm*—Armstrong, Westerman Hattori, McLeland & Naughton

[57] ABSTRACT

A conductive filler has a metallic layer having a low melting point formed on its surface. The filler can give an excellent electric/electromagnetic effect to a matrix.

4 Claims, 6 Drawing Sheets

CONDUCTIVE FILLER, CONDUCTIVE PASTE AND METHOD OF FABRICATING CIRCUIT BODY USING THE CONDUCTIVE PASTE

BACKGROUND OF THE INVENTION

1. Field of the Invention

The present invention relates to a conductive filler used for a conductive paste and conductive plastic, etc. and a method of fabricating a circuit body using the conductive paste.

2. Description of the Related Art

The conductive filler includes metallic powder, carbon powder, metallic fiber, metallic flake, metallized glass beads or metallic glass fiber. The conductive filler, which is added to an insulating or highly resistive matrix such as plastic, has been widely used to improve its electric and electromagnetic property.

The conductive fillers added to the matrix are brought into contact with each other to provide the matrix with conductivity. However, the fillers, which are in point contact with one another in most cases, give high contact resistance to hinder the improvement of conductivity.

In addition, since the conductive fillers are brought into contact with one another owing to condensing force of resin binder, the resultant matrix provides a change in the electric resistance due to changes in temperature.

In order to solve the above problem, JP-A 63-18691 proposes a technique of using filler of solder. JP-A 3-48484 proposes a technique of mixing and hardening copper paste and solder paste and carrying out heat treatment to enhance the conductivity of the surface. These techniques, however, required the heat treatment twice or could not actually give good conductivity to the matrix.

SUMMARY OF THE INVENTION

An object of the present invention is to provide an excellent conductive filler capable of giving good electric and electromagnetic effect to a matrix.

Another object of the present invention is to provide a conductive paste having such a filler.

Still another object of the present invention is to provide a method for fabricating an excellent circuit body using the above paste.

In accordance with the first aspect of the present invention, there is provided a conductive filler with a metallic layer having a low melting point formed on the surface.

Preferably, the entire surface of the conductive filler is covered with the metallic layer.

The conductive filler with the metallic layer formed on the surface, although it can be dealt with like a normal conductive filler, can give higher conductivity than a conventional conductive filler does, and give little change in electric resistance even when an environmental temperature is changed.

In accordance with the second aspect of the present invention, there is provided a conductive paste containing the conductive filler.

Further, there is provided a conductive paste containing a metal having a low melting point and a conductive filler.

The conductive paste according to the second aspect has only to be heat treated only once. In addition, when a conductor is formed, the fillers can be bound in not only the surface but also the inside so that the paste permits the conductor having high conductivity to be made.

In accordance with the third aspect of the present invention, there is provided a method for fabricating a circuit body using the conductive paste. This method can easily give an excellent circuit body.

The above and other objects and features of the present invention will be more apparent from the following description taken in conjunction with the accompanying drawings.

DESCRIPTION OF THE PREFERRED EMBODIMENTS

Figure 1:
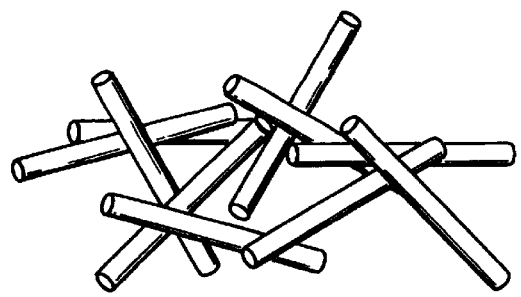
FIG. 1 is a view showing an image of the distributing state of conventional conductive fillers within a matrix.

In the present invention, a metal having a low meting point refers to one which melts or half-melts at the temperature of shaping, hardening or drying of a matrix, when it is used for processing after having been mixed with the matrix. The matrix also includes an alloy. Therefore, the metal which normally exhibits a melting point lower than a room temperature or may be molten in its normal mixing with the matrix must be dealt with under a particular environment and hence cannot be preferably used for the other application than a particular use.

In the present invention, the metallic layer having a low melting point, covered on the entire surface of the conductive filler, permits an electric connection to be made.

The conductive filler to be used into the present invention can be selected from those known at present, taking conditions of use and processing in consideration. Specifically, metallic powder, carbon powder, metallic fiber, carbon fiber, scale-shaped metal, metallized glass beads or metallized glass fiber can used. Further, inorganic or organic fiber imparted with conductivity, such as metal-plated carbon fiber or metal-plated ceramic fiber, can be preferably used. Among them, a fiber-, branch-, scale-shaped filler having a length of 100 μm or less, preferably 10 μm and an aspect ratio of 2 or larger is particularly preferable.

Further, the metallic filler is preferably made of silver, copper and copper plated with silver. In addition, the metallic filler is supplied with flux for soldering when it is used, otherwise the metallic filler previously treated by the flux of soldering is used.

Adoption of non-heating plating such as electric plating and non-electrolytic plating permits a metallic layer having a low melting point to be applied on the surface of the filler with no heating. A technique of melting plating permits the metallic layer having a low melting point to be applied at relatively low cost. A technique relative to depositing of a thin film under reduced pressure such as sputtering permits a metallic layer having a low melting point to be deposited on the surface of the filler.

Sputtering uses a phenomenon that metal atoms are discharged from a cathode and applied to an environment during a glow discharge which occurs when an suitable DC or AC voltage is applied between two electrodes under a low pressure of gas such as Ar or H with high purity. The sputtering, which is a dry technique unlike the other techniques, requires a smaller scale of equipment than a moist technique (plating), a smaller number of manufacturing steps and shorter processing time and does not require processing of a waste solution and hence equipment therefor.

A method of film deposition by sputtering is preferably carried out through DC biasing. The DC biasing causes remarkable activation due to ion bombardment so that the resultant metallic layer is dense and provides very good contact. In addition, rearrangement effects of stacked atoms permits the orientation of the film to be controlled.

The effect of the present invention can be assured by depositing the metallic layer having a low melting point on the entire surface of the filler. Therefore, plating of the short fiber-like conductive filler is preferably carried out in such a manner that a short fiber filler, after previously cut, is plated, rather than a long fiber filler, after plated, is cut.

In the present invention, all matrixes which are generally used to form paste can be used. As basic resin for constructing a matrix, thermoplastic resin, thermosetting resin and their mixture can be used. Solvent may be added to improve its processing capability. Further, several kinds of reforming agent such as oxidation protection agent, dispersant, thixotropy improving agent, levelling agent and defoaming agent can be added to improve several kinds of characteristics as long as it does not hinder the effect of the present invention.

Now referring to a model view of FIG. 1, an explanation will be given of the operation when a conductive body is constructed using a conductive filler having a low melting point metallic layer on the surface.

FIG. 1 is an imagery view showing the distributed state of conductive fillers (now, short fibriform conductive fillers) within a matrix according to the prior art in the matrix.

The conductivity of the matrix, which occurs owing to contact of the conductive fillers to one another, is point contact exhibiting contact resistance.

Figure 2:
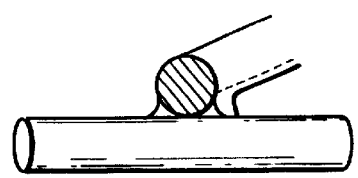
FIG. 2 is a model view showing the manner of contact between fillers when the fillers each having a low melting point on the surface are used.

FIG. 2 is a model view showing the manner of contact when the conductive fillers according to the present invention are used. When the fillers each having a low melting point metallic layer on the surface are brought into contact with one another, the contact therebetween is plane contact and also metallic contact, which results in small electric resistance. In addition, the contact is stable at a temperature lower than that which the metal is half molten or molten and not substantially affected by the temperature.

The fillers each having a low melting point metallic layer on the entire surface can be brought into contact in their planes so that their contact can be assured.

On the other hand, when a conductive body is formed using a conductive paste containing a low melting point and conductive fillers, the fillers on both the surface and inside thereof are brought into electric contact. The conductive body thus formed gives very good conductivity as compared with the prior art.

As resin binder of the conductive paste according to the present invention, the resins which are commonly used can be employed. Among them, the thermosetting resin such as epoxy resin or phenol resin can be dealt with before hardening and hardened at the subsequent heat treatment.

The method for fabricating a circuit body according to the present invention can be carried out using the aforementioned paste, i.e. paste containing the conductive fillers each having a low melting point metallic layer on the surface, or containing both low melting point metal and conductive fillers. Namely, an improved circuit body can be fabricated in such a manner that the conductive paste can be applied on the portion where the circuit body is to be formed, or heat-treated at the temperature in which the low melting point metal contained in the conductive paste is molten or half-molten. The circuit body thus fabricated, in which the fillers are surely kept in electric contact, is a thermally stable circuit body which is not affected by the expansion or contraction of the base resin due to changes in temperature.

Now referring to the model view, an explanation will be given of the method for applying conductive paste.

Figure 3:
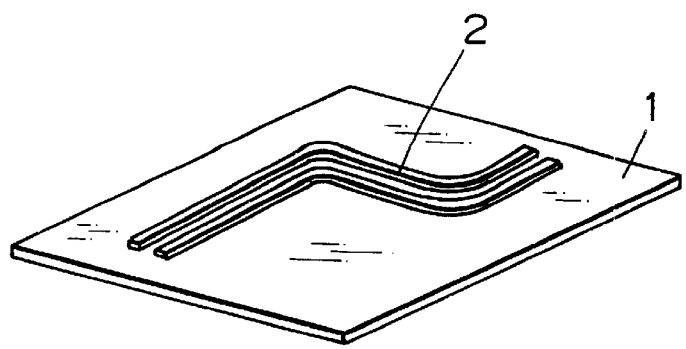
FIG. 3 is a perspective view showing an exemplary (application to a two-dimensional shape by screen printing) of the method for fabricating a circuit body according to the present invention.
Figure 4:
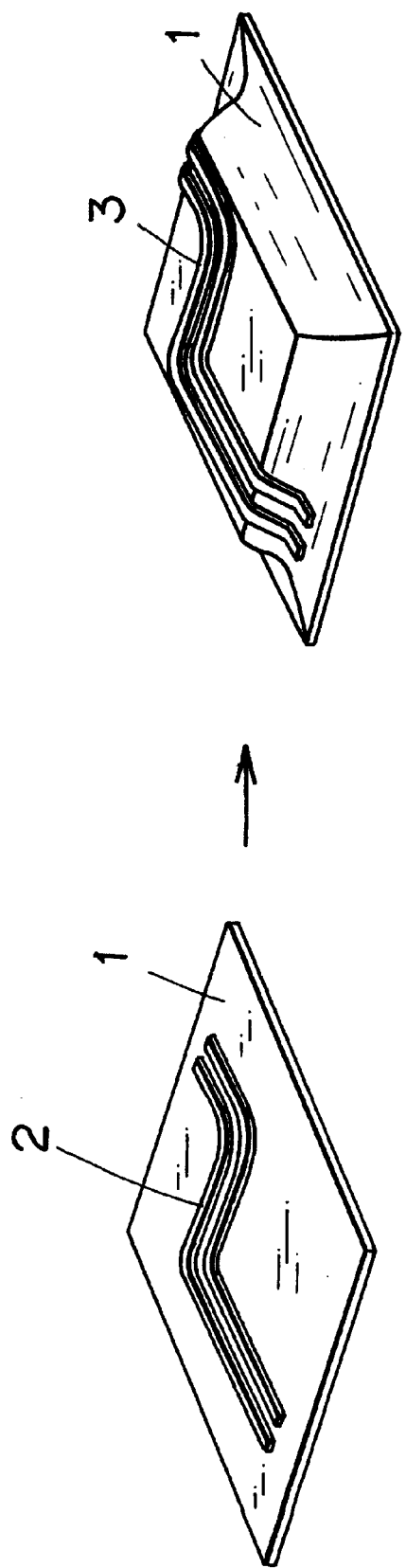
FIG. 4 is a perspective view showing an exemplary model view (application to a three-dimensional shape by screen printing) of the method for fabricating a circuit body according to the present invention.

For example, methods can be adopted which applies a conductive paste 2 on the surface of resin insulator 1 such as epoxy glass by a screen printing technique (FIG. 3), and as its application, likewise applies the conductive paste 2 on a plate-like resin insulator by the screen printing technique to form the resin insulator 1 into a three-dimensional shape by a vacuum molding technique, thereby making a circuit body 3 thereon (FIG. 4).

Figure 5:
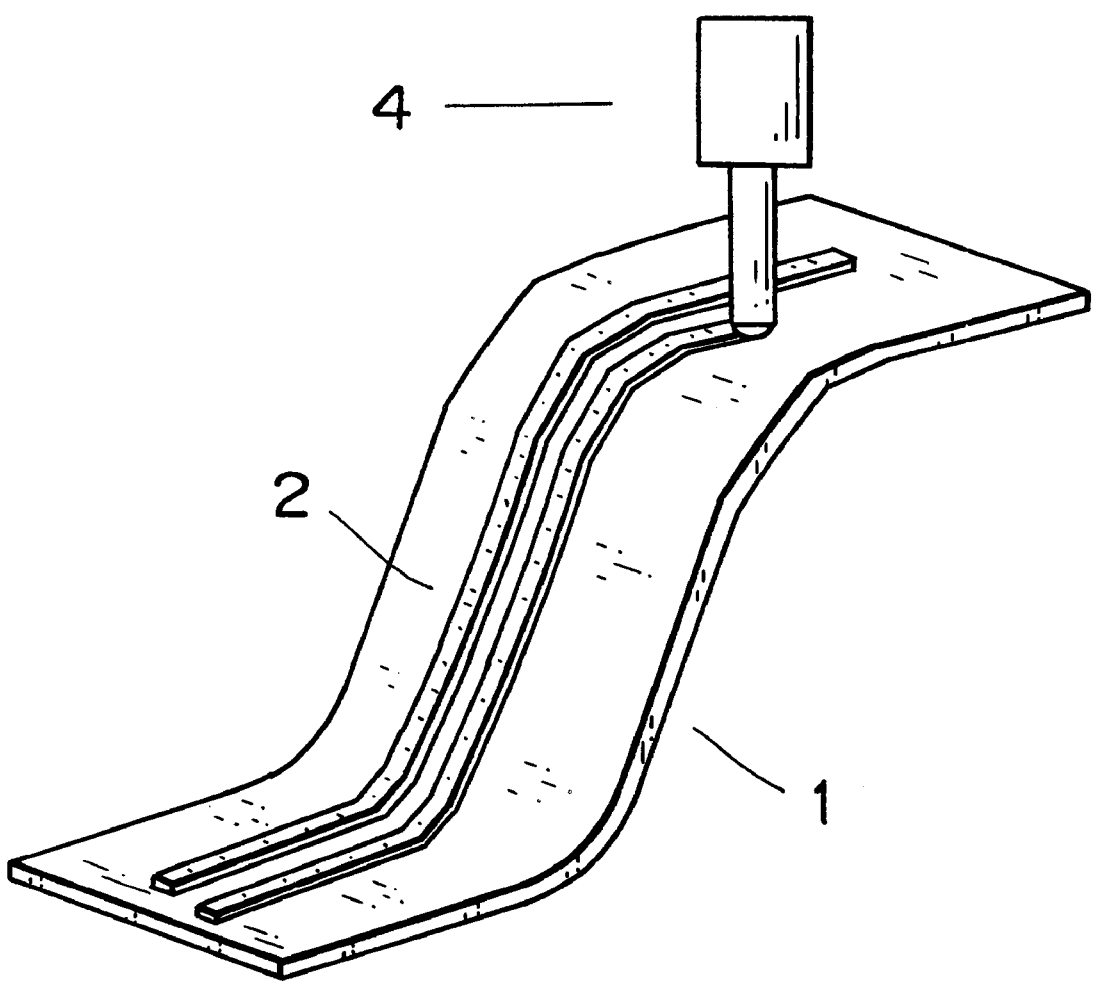
FIG. 5 is a perspective view of an exemplary model (another application to a three-dimensional shape using a discharging device)

As shown in FIG. 5, a method can be adopted which applies a conductive paste 2 on the surface of the resin insulator 1 having a three-dimensional shape using a discharging device 4.

After the conductive paste has been applied, heat treatment is effected to complete the circuit body 3.

The heat treatment can be effected by drying using hot wind, near-or far-infrared rays, high frequency induction heating or microwaves. Among them, the heating by the near-infrared rays, high frequency or microwaves, which does not affect the environmental resin insulator (substrate), is preferred.

CONCRETE EMBODIMENTS OF THE INVENTION

Embodiment 1 (Conductive Filler With a Metallic Layer Having a Low Melting Point Formed on the Surface)

Under the condition described below, by sputtering (DC biasing technique), a lead(Pb)-tin(Sn)-bismuth(Bi) layer was formed on the entire surface of copper powder (FCC- 2P-99 available from FUKUDA KINZOKUHAKUFUN KOGYO CO.LTD.).

The object is vibrated during the sputtering so that the surface of the layer thus formed is uniform.

In this embodiment, a target material (lead (Pb): 43% by weight, tin(Sn): 43% by weight and bismuth (Bi): 14% by weight) having a composition of a liquid phase line of 163° C. and a solid phase line of 143° C. was used. However, by changing the composition, the phase transition temperature can be varied optionally. For example, if the composition of the ternary alloy is changed to be lead of 40% by weight, tin of 30% by weight and bismuth of 30% by weight, the liquid phase line can be shifted to 140° C.

Sputtering Condition:

Environmental Pressure: 2.0 Pa

Sputtering Voltage: 10 kV

Processing time: 1200 sec

Thickness of the layer formed: 0.12 $\mu$m

The filler plating copper powder thus obtained by sputtering, serving as fillers, is mixed with a matrix resin component at a weight mixing ratio as shown in Table 1 and further mixed by a roll mixer to obtain a conductive paste according to the present invention (Embodiment 1).

For comparison, the conductive paste according to a first comparative example was obtained using the copper powder (FCC-2P-99 available from FUKUDA KINZOKUHAKU-FUN KOGYO CO.LTD.) not subjected to the sputtering.

These conductive pastes are heat-treated for an hour at a temperature of 150° C. to provide conductors. The electric resistivity of each conductor was measured by a four-probe method and the result of measurement is shown in Table 1.

TABLE 1

|  | 1st Embodiment | 1st Comparative Example |
| --- | --- | --- |
| Resol type phenol resin (PL4348 available from GUNEI KAGAKU CO. LTD) | 100 parts | 100 parts |
| Plating Copper Powder | 600 parts |  |
| Copper Powder |  | 600 parts |
| Organic Solvent (butyl carbitol) | 20 parts | 20 parts |
| Electric Resistivity ($\times 10^{-4}$ $\Omega \cdot$ cm) | 1.0 | 1.2 |

It is seen from Table 1 that the conductor constructed of the paste according to the first embodiment of the present invention exhibits lower electric resistivity than the first comparative example using the conventional copper powder.

The influence of temperature on the electric resistivity of each of these conductors was examined.

Figure 6:
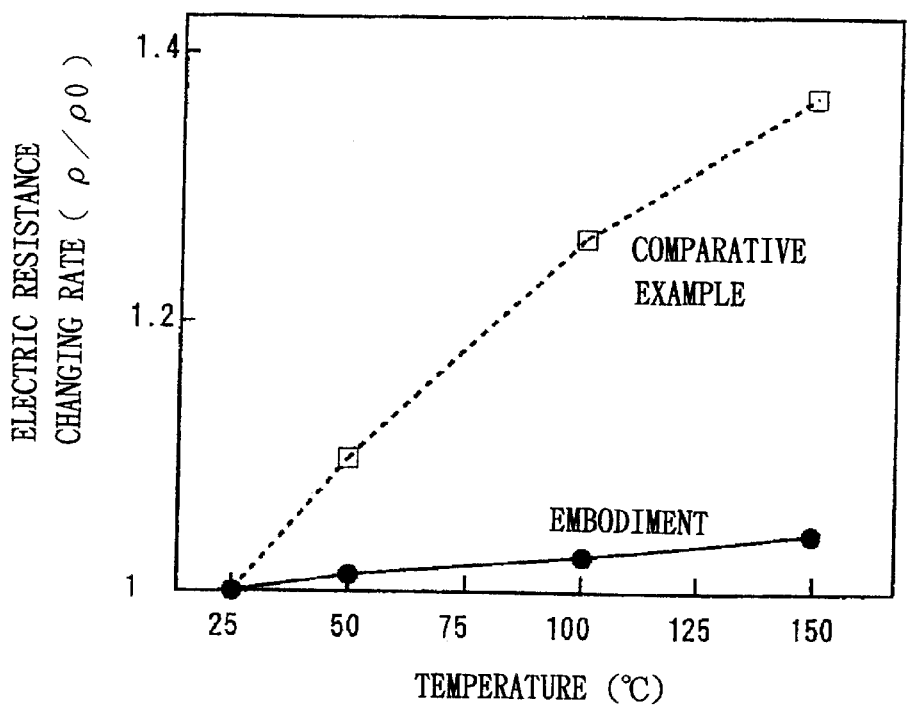
FIG. 6 is a graph showing a changing rate in electric resistance in the conductors according to the first embodiment of the present invention and a first comparative example.

The examination is carried out in a constant temperature bath, and the result thereof is shown in FIG. 6 as an electric resistivity changing rate in terms of the electric resistance of 1 at 25° C.

It can be seen from FIG. 6 that the changing rate of the electric resistance of the conductor constructed of the conductive paste according to the present invention is very low and excellent.

In the prior art, solder was separated from the fillers within the matrix. On the other hand, as a result of observation of the inside of the conductor according to the first embodiment, separation of the lead-tin-bismuth layer from the fillers cannot be seen.

The above two kinds of conductive pastes were linearly applied on a glass epoxy substrate, respectively under the same condition using a discharge device shown as a model in FIG. 5, and heat-treated for an hour at 150° C. using a hot wind drier to make two kinds of circuit bodies.

Figure 7:
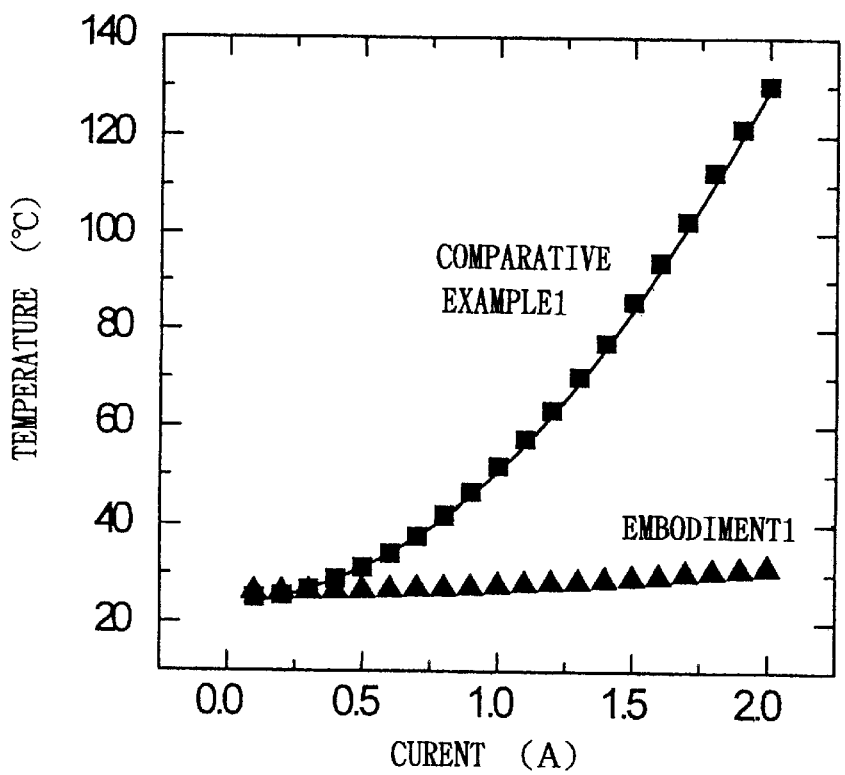
FIG. 7 is a graph showing the state of heat generation when a current is caused to flow through the circuit body according to an embodiment of the present invention and through the circuit body according a comparative example.

The temperature of the circuit body when a current flowing through these circuit bodies is increased stepwise of 0.2 A is measured and the result thereof is shown in FIG. 7.

It can be seen from FIG. 7 that the circuit body fabricated using the conductive paste according to the present invention, i.e., the circuit body fabricated by the method according to the present invention is an excellent circuit body which can give a very small increase in temperature when a large current is caused to flow.

Next, the conductive stability of the conductor was measured and evaluated. With the environmental temperature held at 120° C., changes in the electric resistivity of the circuit body was measured by the four-probe method. The measurement result is shown in FIG. 8.

Figure 8:
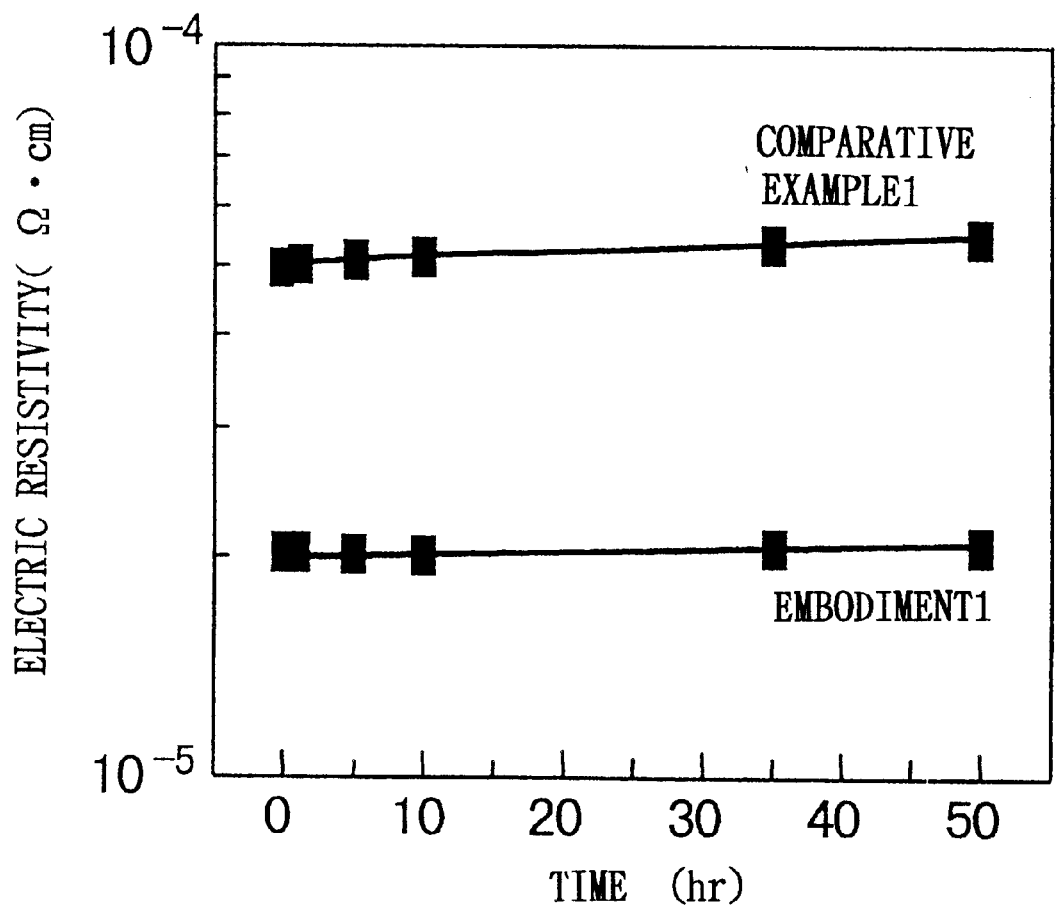
FIG. 8 is a graph showing conductive stability of the conductive body of an embodiment by the method of fabricating a circuit body according to the present invention and a circuit body according to a comparative example.

It can be seen from FIG. 8 that the circuit body constructed of the conductive paste according to the present invention maintains a small value even when it is exposed in a high temperature environment for a long time.

Further, the dependency of the electric resistivity of the circuit body on an environmental temperature was evaluated. Specifically, while the environmental temperature is changed, the change in the resistance of the circuit body and further its changing rate for the initial resistance were calculated. The calculation result is shown in FIG. 9.

Figure 9:
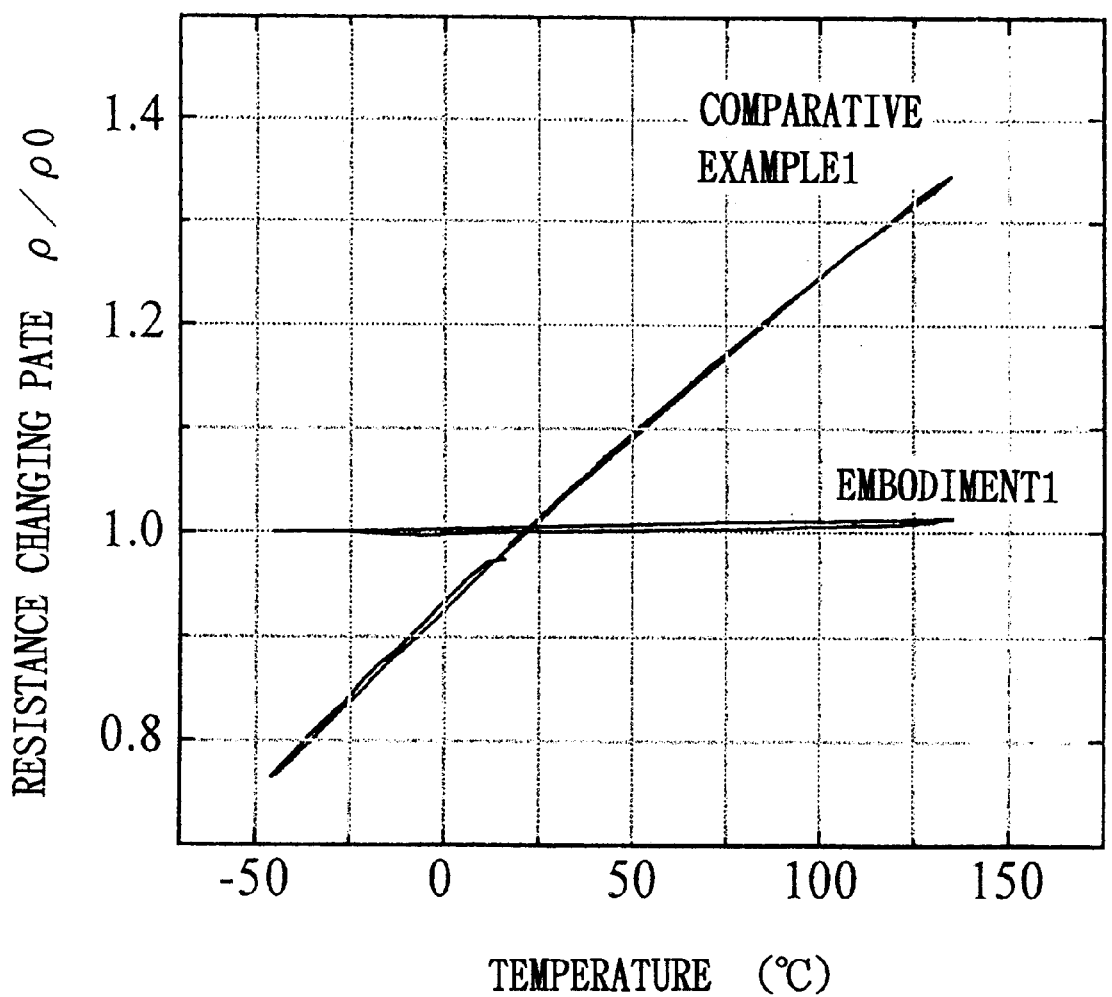
FIG. 9 is a graph showing the dependency of a resistance on a temperature of the circuit body according the method for fabricating the circuit body and the circuit body according to a comparative example.

It can be seen from FIG. 9 that the changing rate of the electric resistivity of the circuit body constructed using the conductive paste according to the present invention varies very little over a wide temperature range from −50° C. to 120° C.

Embodiment 2 (Conductive Paste Composed of a Low Melting Point Metal and a Conductive Filler)

A filler, composed of a ternary alloy of lead(Pb) of 43%-tin(Sn) of 43%-bismuth(Bi) of 14% and copper powder (FCC-2P-99 having an average grain diameter of 10 $\mu$m available from FUKUDA KINZOKUHAKUFUN KOGYO CO.LTD.), was used. The filler is mixed with a matrix resin component by a weight composition ratio as shown in FIG. 2 and further mixed by a roll mixer to obtain a conductive paste according to the present invention (Embodiment 2).

For comparison, the conductive paste according to a second comparative example was obtained using the copper powder (FCC-2P-99 available from FUKUDA KINZOKU-HAKUFUN KOGYO CO.LTD.) not subjected to the sputtering.

These conductive pastes are heat-treated for an hour at a temperature of 150° C. to provide conductors. The electric resistivity of each conductor was measured by the four-probe method and the result of measurement is shown in Table 2.

TABLE 2

|  | 2nd Embodiment | 2nd Comparative Example |
| --- | --- | --- |
| Resol type phenol resin (PL4348 available from GUNEI KAGAKU CO. LTD) | 100 parts | 100 parts |
| Copper Powder | 600 parts | 620 parts |

TABLE 2-continued

|  | 2nd Embodiment | 2nd Comparative Example |
|---|---|---|
| Ternary Metal of Pb—Sn—Bi | 20 parts |  |
| Organic Solvent (butyl carbitol) | 21 parts | 21 parts |
| Electric Resistivity (×10$^{-4}$ Ω · cm) | 0.83 | 1.2 |

It is seen from Table 2 that the conductor constructed of paste according to the second embodiment of the present invention exhibits lower electric resistivity than the second comparative example using the conventional copper powder.

As a result of examination of the inside of the conductive body of the paste according to the present invention, the fillers in the inside are bent with each other by a low melting point metal like those in the surface of the conductor.

In comparison to the technique disclosed in JP-A-63-18691, the conductive paste containing the low melting point metal and conductive filler according to the present invention has only to be heat-treated once. In the conductive body constructed using such a paste, the fillers can be bent with one another not only in the surface but also the inside.

What is claimed is:

1. A method of fabricating a conductive layer on a substrate comprising the steps of:

producing a conductive filler comprising a conductive metal powder having a metallic layer with a low melting point by sputtering a metal with a low melting point onto said conductive metal powder while vibrating said conductive metal powder;

mixing said conductive filler with a matrix resin, thereby obtaining a conductive paste;

applying said conductive paste on said substrate; and heating said conductive paste, thereby forming said conductive layer.

2. A method of fabricating a conductive layer on a substrate according to claim 1, wherein said matrix resin is a thermosetting resin.

3. A method of fabricating a conductive layer on a substrate according to claim 1, further comprising the step of:

after applying said conductive paste on said substrate, formulating said substrate into a three dimensional shape by a vacuum molding technique.

4. A method of fabricating a conductive layer on a conductive layer on a substrate according to claim 1, wherein said substrate has a three dimensional shape, and said paste is applied on a surface of said substrate using a discharging device.

* * * * *